(12) United States Patent
Xia et al.

(10) Patent No.: US 11,580,769 B2
(45) Date of Patent: Feb. 14, 2023

(54) DISPLAY PANEL AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Wei Xia, Beijing (CN); Huaisen Ren, Beijing (CN); Yongzhan Han, Beijing (CN); Peng Hou, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/330,388

(22) Filed: May 25, 2021

(65) Prior Publication Data

US 2022/0114355 A1   Apr. 14, 2022

(30) Foreign Application Priority Data

Oct. 13, 2020  (CN) .......................... 202011092275.4

(51) Int. Cl.
| | |
|---|---|
| *G06V 40/13* | (2022.01) |
| *G06F 3/041* | (2006.01) |
| *G06F 3/044* | (2006.01) |
| *H01L 27/32* | (2006.01) |
| *H01L 51/52* | (2006.01) |

(52) U.S. Cl.
CPC ........ *G06V 40/1306* (2022.01); *G06F 3/0412* (2013.01); *G06F 3/0443* (2019.05); *G06F 3/0446* (2019.05); *H01L 27/322* (2013.01); *H01L 27/323* (2013.01); *H01L 27/3234* (2013.01); *H01L 27/3244* (2013.01); *H01L 51/5253* (2013.01); *G06F 2203/04111* (2013.01); *G06F 2203/04112* (2013.01)

(58) Field of Classification Search
CPC . G06V 40/1306; H01L 27/322; H01L 27/323; H01L 27/3234; H01L 27/3244; H01L 51/5253; G06F 3/0446; G06F 3/0443; G06F 3/0412
USPC .................................................. 345/173–174
See application file for complete search history.

(56) References Cited

U.S. PATENT DOCUMENTS

| | | | | |
|---|---|---|---|---|
| 10,509,937 | B2 * | 12/2019 | Lee ....................... | G06F 3/0412 |
| 2017/0006245 | A1 * | 1/2017 | Akhavan Fomani .. | G06V 40/13 |
| 2017/0213876 | A1 * | 7/2017 | Ohsawa ............... | H01L 51/5265 |
| 2017/0344165 | A1 * | 11/2017 | Heo ........................ | H01L 27/323 |
| 2017/0364726 | A1 * | 12/2017 | Buchan .................. | H01L 41/047 |
| 2017/0372113 | A1 * | 12/2017 | Zhang .................. | H01L 27/3244 |
| 2019/0205594 | A1 * | 7/2019 | Lee ........................ | G06F 1/1684 |
| 2019/0303639 | A1 * | 10/2019 | He ....................... | G06V 40/1394 |
| 2020/0279087 | A1 * | 9/2020 | Seo ....................... | G01S 7/52079 |

* cited by examiner

*Primary Examiner* — Kwin Xie
(74) *Attorney, Agent, or Firm* — Ling Wu; Stephen Yang; Ling and Yang Intellectual Property (57) ABSTRACT

Provided are a display panel and a display apparatus. The display panel includes a back panel, and a fingerprint identification unit, a specular reflection film layer and a touch unit which are disposed on the back panel, wherein the fingerprint identification unit includes a fingerprint identification electrode layer, the touch unit includes a touch electrode layer; and the fingerprint identification electrode layer, the specular reflection film layer and the touch electrode layer are disposed in a same layer.

19 Claims, 3 Drawing Sheets

DISPLAY PANEL AND DISPLAY APPARATUS

CROSS-REFERENCE TO RELATED APPLICATION

The present application claims the priority of Chinese Patent Application No. 202011092275.4 filed to the CNIPA on Oct. 13, 2020, the content of which is hereby incorporated by reference.

TECHNICAL FIELD

One or more embodiments of the present disclosure relate to, but are not limited to, the technical field of display, in particular to a display panel and a display apparatus.

BACKGROUND

With rapid development of display technology, the market demand for display products combining mirror and display is more and more extensive. Mirror display products may be applied not only to scenarios such as home, shopping malls, advertising, beauty and cosmetics, but also to scenarios such as car rear view mirrors.

At present, a manufacturing method of mirror display products is to manufacture a layer of highly reflective patterned metal on an encapsulation layer, which needs an extra process; and to adopt plug-in Touch Sensor Panels (TSPs) to realize touch of the mirror display products, which will increase thickness and cost of the panels. Moreover, a specular reflection material is made of highly reflective metal, which cannot realize a fingerprint identification function.

SUMMARY

The following is a summary of the subject matter described in detail in the present disclosure. This summary is not intended to limit the protection scope of the claims.

One or more embodiments of the present disclosure provide a display panel including a back panel, and a fingerprint identification unit, a specular reflection film layer and a touch unit, wherein the fingerprint identification unit, the specular reflection film layer and the touch unit are disposed on the back panel, the fingerprint identification unit includes a fingerprint identification electrode layer; the touch unit includes a touch electrode layer; and the fingerprint identification electrode layer, the specular reflection film layer and the touch electrode layer are disposed in a same layer.

In an exemplary embodiment, the fingerprint identification electrode layer and the touch electrode layer are spaced by the specular reflection film layer, and the specular reflection film layer is grounded.

In an exemplary embodiment, a first spacing is disposed between the fingerprint identification electrode layer and the specular reflection film layer, and a second spacing is disposed between the specular reflection film layer and the touch electrode layer.

In an exemplary embodiment, the fingerprint identification unit further includes a fingerprint identification control circuit disposed in the back panel, and the fingerprint identification control circuit is connected with the fingerprint identification electrode layer.

In an exemplary embodiment, the fingerprint identification unit further includes a first electrode layer and a second electrode layer, and the fingerprint identification electrode layer is connected with the fingerprint identification control circuit through the first electrode layer and the second electrode layer; the display panel is an organic light emitting diode display panel, and an organic light emitting diode is disposed in the back panel; and the second electrode layer and an anode layer of the organic light emitting diode are disposed in a same layer.

In an exemplary embodiment, a thin-film encapsulation layer is disposed between the back panel and the first electrode layer, and the first electrode layer is connected with the second electrode layer through a first via hole disposed on the thin-film encapsulation layer; and a first over coat layer is disposed between the thin-film encapsulation layer and the fingerprint identification electrode layer, and the fingerprint identification electrode layer is connected with the first electrode layer through a second via hole disposed on the first over coat layer.

In an exemplary embodiment, the touch electrode layer includes multiple first touch electrodes disposed in sequence and multiple second touch electrodes disposed in sequence; the first touch electrodes and the second touch electrodes are staggered, and the first touch electrodes and the second touch electrodes are configured to form a mutual capacitance structure.

In an exemplary embodiment, the touch unit includes a bridge electrode and a connection electrode; wherein the bridge electrode is configured to connect two adjacent first touch electrodes, the connection electrode is configured to connect two adjacent second touch electrodes; the bridge electrode and the first electrode layer are disposed in a same layer as, and the connection electrode and the touch electrode layer are disposed in a same layer.

In an exemplary embodiment, the organic light emitting diode further includes an emitting layer, and an orthographic projection of the emitting layer on the back panel does not overlap with orthographic projections of the fingerprint identification electrode layer, the specular reflection film layer and the touch electrode layer respectively on the back panel.

In an exemplary embodiment, the display panel further includes a color filter disposed in correspondence to the emitting layer, wherein the color filter, the fingerprint identification electrode layer, the specular reflection film layer and the touch electrode layer are disposed in a same layer.

In an exemplary embodiment, the touch electrode layer includes multiple mesh metal wires and spacer regions between the mesh metal wires, and the fingerprint identification electrode layer includes multiple fingerprint identification sub-electrodes; the color filter, the fingerprint identification sub-electrode and the specular reflection film layer are disposed in the spacer region.

In an exemplary embodiment, color filters are disposed between the mesh metal wires and the fingerprint identification sub-electrodes, and the color filters and the fingerprint identification sub-electrodes are respectively distributed in an array in the spacer regions.

In an exemplary embodiment, a second over coat layer is disposed on a side of the fingerprint identification electrode layer away from the back panel.

In an exemplary embodiment, the fingerprint identification electrode layer, the specular reflection film layer and the touch electrode layer are made of a same metal material.

One or more embodiments of the present disclosure further provide a display apparatus which includes any one of the display panels above mentioned.

Other aspects will become apparent upon reading and understanding accompanying drawings and the detailed description.

BRIEF DESCRIPTION OF DRAWINGS

The drawings required to be used in the embodiments of the present disclosure will be briefly described as follows. It is apparent that the drawings in the following description are only one or more embodiments of the present disclosure, for those of ordinary skill in the art, other drawings may be obtained based on these drawings without paying any creative work.

DETAILED DESCRIPTION

The present disclosure will be further described in detail below in combination with specific embodiments and with reference to the accompanying drawings. The following embodiments serve to illustrate the present disclosure, but are not intended to limit the scope of the present disclosure. It should be noted that embodiments in the present disclosure and features in the embodiments may be combined with each other randomly if there is no conflict.

Unless otherwise defined, technical terms or scientific terms used in one or more embodiments of the present disclosure shall have common meanings as understood by those of ordinary skills in the art to which the present disclosure pertains. The words "first", "second" and the like used in one or more embodiments of the present disclosure do not represent any order, quantity or importance, but are merely used to distinguish among different components. A word such as "include", "contain", or the like, means that elements or articles preceding the word cover elements or articles listed after the word and their equivalents, and do not exclude other elements or articles. Similar words such as "connect" or "link" are not limited to physical or mechanical connections, but may include electrical connections, whether direct connections or indirect connections. "Up", "down", "left", "right" and the like are merely used to indicate a relative positional relationship. Upon the change of an absolute position of a described object, the relative positional relationship may change accordingly.

Figure 1:
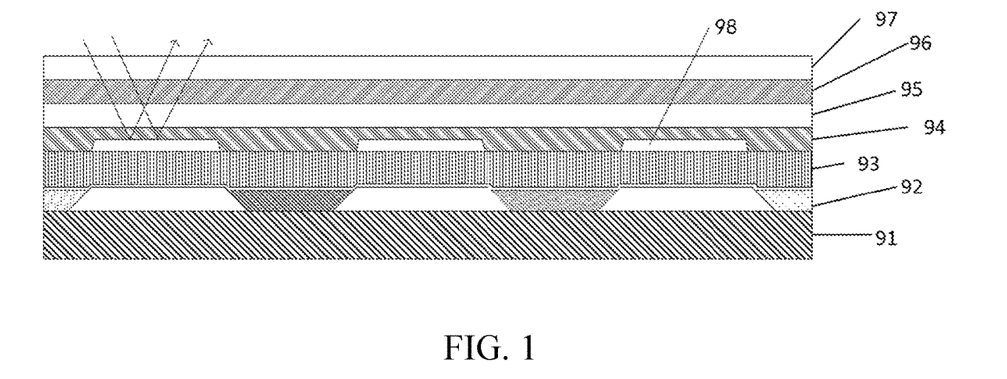
FIG. 1 is a schematic diagram of a structure of a mirror display apparatus.

FIG. 1 is a schematic diagram of a structure of a mirror display apparatus. As shown in FIG. 1, an emitting layer 92 (EL), a thin-film encapsulation layer 93 (TFE), a first optical clear adhesive layer 94 (OCA), a touch sensor panel 95 (TSP), a second optical clear adhesive layer 96 (OCA) and a cover glass 97 (CG) are sequentially disposed on a back panel 91 (BP). In order to realize mirror display, a highly reflective patterned metal layer is usually manufactured on the thin-film encapsulation layer 93 as a specular reflection layer 98, which requires an extra process. Touch is realized by using a plug-in touch sensor panel 95 (TSP), which will increase a thickness and cost of the display panel, and is not conducive to integration of display technology. In addition, since the specular reflection layer 98 is a highly reflective metal layer, an in-screen capacitance fingerprint identification technology and an optical fingerprint identification technology cannot be realized in the mirror display apparatus.

Figure 2:
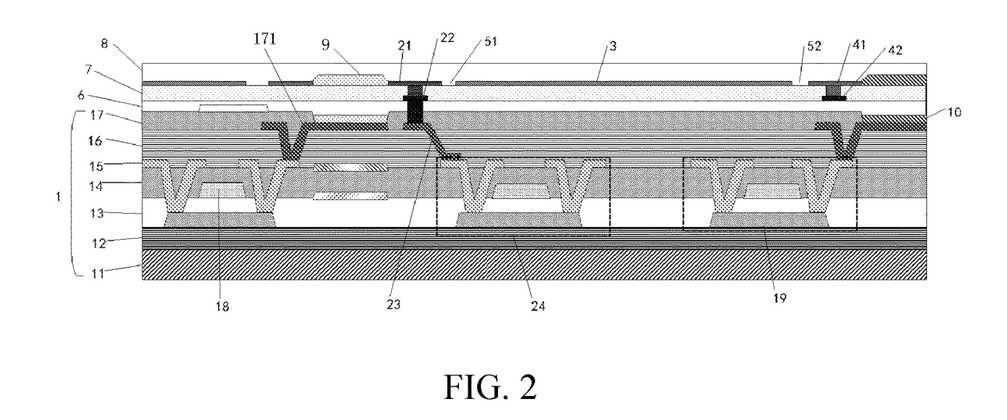
FIG. 2 is a schematic diagram of a structure of a display panel according to one or more embodiments of the present disclosure.

One or more embodiments of the present disclosure provide a display panel. As shown in FIG. 2, the display panel includes a back panel 1, and a fingerprint identification unit, a specular reflection film layer 3 and a touch unit which are disposed on the back panel 1. The fingerprint identification unit includes a fingerprint identification electrode layer 21 configured to realize a fingerprint identification function of the display panel. The touch unit includes a touch electrode layer 41 configured to realize a touch function of the display panel. The fingerprint identification electrode layer 21, the specular reflection film layer 3 and the touch electrode layer 41 are all made of a metal material and disposed in a same layer.

In this exemplary embodiment, the fingerprint identification electrode layer 21 of the fingerprint identification unit, the touch electrode layer 41 of the touch unit and the specular reflection film layer 3 are disposed in the same layer, so that all of the fingerprint identification electrode layer 21, the touch electrode layer 41 and the specular reflection film layer 3 may realize specular reflection and the fingerprint identification function of the mirror display apparatus. There is no need to use a plug-in touch sensor panel (TSP), which can reduce the thickness of the display panel and save the cost. Scattering of the mirror display is reduced by disposing the touch electrode layer 41 and the specular reflection film layer 3 in the same layer. In addition, the fingerprint identification electrode layer 21, the touch electrode layer 41 of the touch unit and the specular reflection film layer 3 are disposed in the same layer, and there is no need to manufacture a highly reflective patterned metal on the encapsulation layer as the specular reflection film layer 3, so there is no need to add an extra process, as a result the process flow is simplified.

In an exemplary embodiment, the fingerprint identification electrode layer 21, the touch electrode layer 41 of the touch unit and the specular reflection film layer 3 are disposed in the same layer, that is, distances from surfaces of the fingerprint identification electrode layer 21, the touch electrode layer 41 of the touch unit and the specular reflection film layer 3 near the back panel 1 to the back panel 1 are the same. Alternatively, if the fingerprint identification electrode layer 21, the touch electrode layer 41 of the touch unit and the specular reflection film layer 3 are made of a same material, the fingerprint identification electrode layer 21, the touch electrode layer 41 of the touch unit and the specular reflection film layer 3 are disposed in a same layer, that is, the fingerprint identification electrode layer 21, the touch electrode layer 41 of the touch unit and the specular reflection film layer 3 may be formed by one patterning process.

In an exemplary embodiment, the fingerprint identification unit is a capacitive fingerprint identification unit, and a specific structure of the capacitive fingerprint identification unit is not limited in the embodiments of the present disclosure, as long as the fingerprint identification unit includes the fingerprint identification electrode layer 21 configured to perform capacitance sensing.

In one or more embodiments of the present disclosure, as shown in FIG. 2, the specular reflection film layer 3 is disposed between the fingerprint identification electrode layer 21 and the touch electrode layer 41; the fingerprint recognition electrode layer 21 and the touch electrode layer 41 are spaced by the specular reflection film layer 3, and the specular reflection film layer 3 is grounded, thereby reducing mutual effects between the fingerprint identification electrode layer 21 and the touch electrode layer 41.

In an exemplary embodiment, as shown in FIG. 2, a first spacing 51 is disposed between the fingerprint identification electrode layer 21 and the specular reflection film layer 3, thereby separating the fingerprint identification electrode layer 21 from the specular reflection film layer 3; a second spacing 52 is disposed between the specular reflection film layer 3 and the touch electrode layer 41, thereby separating the specular reflection film layer 3 from the touch electrode layer 41. In this exemplary embodiment, sizes of the first spacing 51 and the second spacing 52 are not limited, and may be adjusted according to actual needs. The specular reflection film layer 3 may successfully space the fingerprint identification electrode layer 21 from the touch electrode layer 41 by setting of the first spacing 51 and the second spacing 52, thereby reducing mutual effects between the fingerprint identification electrode layer 21 and the touch electrode layer 41.

In one or more embodiments of the present disclosure, as shown in FIG. 2, the fingerprint identification unit further includes a fingerprint identification control circuit 24 disposed in the back panel 1, the fingerprint identification control circuit 24 is connected with the fingerprint identification electrode layer 21, and a fingerprint identification signal sensed by the fingerprint identification electrode layer 21 may be processed through the fingerprint identification control circuit 24. Film layers corresponding to the fingerprint identification control circuit 24 and film layers corresponding to a pixel circuit 19 in the back panel 1 may be disposed in a same layer, so that the film layers corresponding to the fingerprint identification control circuit 24 may be manufactured while film layers of the pixel circuit 19 are manufactured, thereby reducing process acts.

In an exemplary embodiment, the fingerprint recognition control circuit 24 is a thin film transistor (TFT).

In some exemplary embodiments of the present disclosure, the display panel is an organic light emitting diode display panel, and the back panel 1 is provided with an organic light emitting diode. As shown in FIG. 2, the fingerprint identification unit further includes a first electrode layer 22 and a second electrode layer 23, and the fingerprint identification electrode layer 21 is connected with the fingerprint identification control circuit 24 through the first electrode layer 22 and the second electrode layer 23. In an exemplary embodiment, the fingerprint identification electrode layer 21 is connected with a terminal of the first electrode layer 22, the other terminal of the first electrode layer 22 is connected with an end of the second electrode layer 23, and the other terminal of the second electrode layer 23 is connected with a source or a drain of the fingerprint identification control circuit 24, so that fingerprint identification signals sensed by the fingerprint identification electrode layer 21 may be transmitted to the fingerprint identification control circuit 24 for processing through the first electrode layer 22 and the second electrode layer 23. The second electrode layer 23 is disposed in a same layer as an anode layer 171 of the organic light emitting diode, so that the second electrode layer 23 may be formed while the anode layer 171 of the organic light emitting diode is formed, thereby reducing the process acts.

In some exemplary embodiments of the present disclosure, a thin-film encapsulation (TFE) layer 6 is disposed between the back panel 1 and the first electrode layer 22, and is configured to isolate moisture and oxygen in the air to prevent water and oxygen from entering the display panel to erode the emitting layer which may cause a problem of degradation of luminescent efficiency of an electroluminescent material, thereby prolonging the service life of the emitting layer. The first electrode layer 22 is connected with the second electrode layer 23 by passing through the thin-film encapsulation layer 6. In an exemplary embodiment, the thin-film encapsulation layer 6 is provided with a first via hole, and the first electrode layer 22 is connected with the second electrode layer 23 through the first via hole.

In an exemplary embodiment, a first over coat (OC) layer 7 is disposed between the thin-film encapsulation layer 6 and the fingerprint identification electrode layer 21, that is, the fingerprint identification electrode layer 21, the touch electrode layer 41 of the touch unit and the specular reflection film layer 3 are all disposed on a side of the first over coat layer 7 away from the thin-film encapsulation layer 6. The first over coat layer 7 is provided with a second via hole, and the fingerprint identification electrode layer 21 is connected with the first electrode layer 22 through the second via hole disposed on the first over coat layer 7. The first over coat layer 7 is a film that may insulate and space the fingerprint identification electrode layer 21, the specular reflection film layer 3, the touch electrode layer 41 from a conductive film layer in the back panel 1, and a material of the first over coat layer 7 may be selected according to actual needs, which is not limited by the embodiments of the present disclosure. In an exemplary embodiment, a second over coat layer 8 is disposed on a side of the fingerprint identification electrode layer 21 away from the back panel 1, and the second over coat layer 8 may be served as a protective layer to protect the fingerprint identification electrode layer 21, the specular reflection film layer 3 and the touch electrode layer 41 from being damaged.

In an exemplary embodiment, the back panel 1 may further include one or more layers of a base substrate (Polyimide, shorted as PI) 11, a buffer layer 12, a gate insulating (GI) layer 13, an interlayer dielectric (ILD) layer 14, a source-drain (SD) layer 15, a planarization (PLN) layer 16, and a pixel define layer (PDL) 17 and other film layers.

Figure 4:
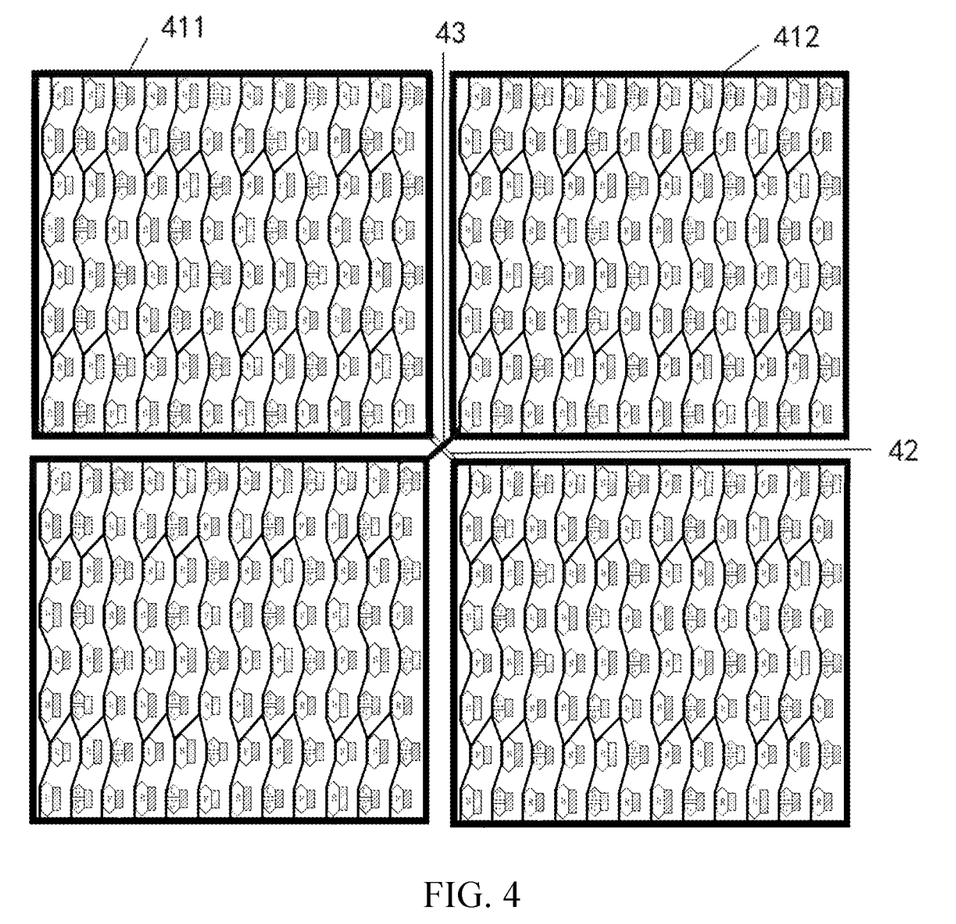
FIG. 4 is a second top view of a display panel according to one or more embodiments of the present disclosure.

In one or more embodiments of the present disclosure, as shown in FIG. 4, the touch electrode layer 41 includes multiple first touch electrodes 411 disposed in sequence and second touch electrodes 412 disposed in sequence. The first touch electrodes 411 and the second touch electrodes 412 are staggered to form a mesh structure, and the first touch electrodes 411 and the second touch electrodes 412 are configured to form a mutual capacitance structure.

In an exemplary embodiment, the first touch electrode 411 is a touch driving electrode (Tx), and the second touch electrode 412 is a touch sensing electrode (Rx). In a touch time period, by applying a touch driving signal to each touch driving electrode (Tx) and a touch sensing signal to each touch sensing electrode (Rx), when there is a touch operation, capacitance between the touch driving electrode (Tx) and the touch sensing electrode (Rx) changes, and a position sensing signal is generated on the touch sensing electrode (Rx), and is transmitted to the touch control circuit of the touch unit, and position coordinates of a touch point are determined by the touch control circuit of the touch unit according to the position sensing signal. Or, by loading a touch driving signal to each touch sensing electrode (Rx) and applying a touch sensing signal to each touch driving electrode (Tx), the touch driving electrodes (Tx) are connected with the touch control circuit, thus the position coordinates of the touch point are determined according to the position sensing signal output by the touch sensing electrodes (Tx), thereby realizing the touch function.

Figure 3:
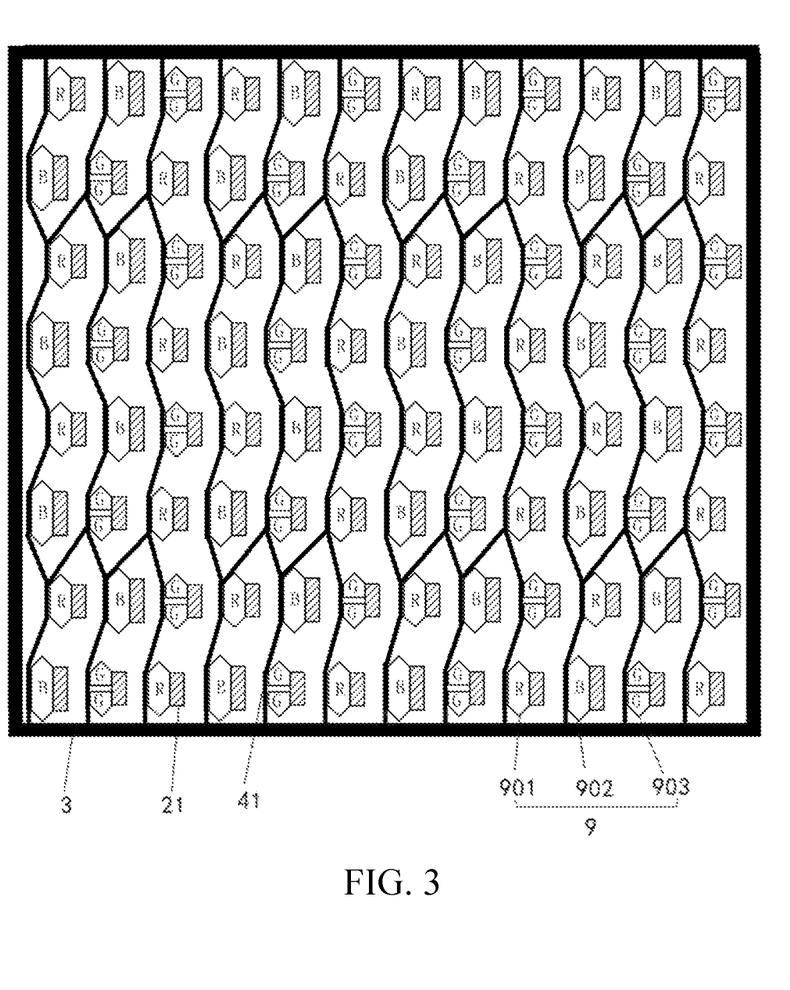
FIG. 3 is a top view of a display panel according to one or more embodiments of the present disclosure.

In an exemplary embodiment, the touch unit further includes a bridge electrode 42 and a connection electrode 43, wherein the bridge electrode 42 is configured to connect two adjacent first touch electrodes 411, and the connection electrode is configured to connect two adjacent second touch electrodes 412; the bridge electrode 42 is disposed in a same layer as the first electrode layer 22, and the connection electrode is disposed in a same layer as the touch electrode layer 41. As shown in FIGS. 2 and 3, the touch unit includes a bridge electrode 42 and a connection electrode 43 which are connected with the touch electrode layer 41, and the bridge electrode 42 and the connection electrode 43 are spaced by an insulating material. The bridge electrode 42 and the first electrode layer 22 are disposed in a same layer, so that the bridge electrode layer 42 may be formed while the first electrode layer 22 is formed, thereby reducing the process acts. As shown in FIG. 4, the connection electrode 43 and the touch electrode layer 41 are disposed in a same layer, so that the connection electrode 43 may be manufactured while the touch electrode layer 41 is manufactured, thereby reducing the process acts. The first touch electrodes 411 and the second touch electrodes 412 are connected into a mesh electrode structure through the bridge electrodes 42 and the connection electrodes 43 to realize a touch function.

In an exemplary embodiment, as shown in FIG. 4, the first touch electrodes 411 and the second touch electrodes 412 have rectangular structures with equal sizes, and the first touch electrodes 411 and the second touch electrodes 412 are staggered, so that each rectangular side of each first touch electrode 411 is adjacent to a rectangular side of a second touch electrode 412, and each rectangular side of each second touch electrode 412 is also adjacent to a rectangular side of a first touch electrode 411. There is a gap between a rectangular side of each first touch electrode 411 and a rectangular side of each second touch electrode 412, so that the first touch electrodes 411 and the second touch electrodes 412 form a mutual capacitance structure. Two diagonally adjacent first touch electrodes 411 are connected by a bridge electrode 42 disposed at a diagonal corner of the first touch electrodes 411, and two diagonally adjacent second touch electrodes 412 are connected by a connection electrode 43 disposed at a diagonal corner of the second touch electrodes 412.

In an exemplary embodiment, the first touch electrode 411 and the second touch electrode 412 may have a structure with other shapes other than rectangular structure, and their sizes may be adjusted as required. In the present exemplary embodiment, specific shapes and sizes of the first touch electrodes 411 and the second touch electrodes 412 are not limited as long as the touch unit includes the touch electrode layer 41 configured to perform touch sensing.

In some exemplary embodiments of the present disclosure, the organic light emitting diode further includes an emitting (EL) layer 10, and an orthographic projection of the emitting layer 10 on the back panel 1 does not overlap with orthographic projections of the fingerprint identification electrode layer 21, the specular reflection film layer 3 and the touch electrode layer 41 respectively on the back panel 1. The fingerprint identification electrode layer 21, the specular reflection film layer 3 and the touch electrode layer 41 are all metal film layers, and an opening is reserved at a position corresponding to the emitting layer 10, so that the fingerprint identification electrode layer 21, the specular reflection film layer 3 and the touch electrode layer 41 will not block the emitting layer 10, and thus the fingerprint identification electrode layer 21, the specular reflection film layer 3 and the touch electrode layer 41 will not affect an original display effect of the organic light emitting diode.

In an exemplary embodiment, the display panel further includes a color filter 9 disposed in correspondence to the emitting layer 10, and the emitting layer 10 is filtered by the color filter 9 to make the display effect of the organic light emitting diode better. The color filter 9 is disposed in a same layer as the fingerprint identification electrode layer 21, the specular reflection film layer 3 and the touch electrode layer 41.

In an exemplary embodiment, the color filter 9, the fingerprint identification electrode layer 21, the specular reflection film layer 3 and the touch electrode layer 41 are disposed in the same layer, that is, distances from surfaces of the color filter 9, the fingerprint identification electrode layer 21, the touch electrode layer 41 of the touch unit and the specular reflection film layer 3 near the back panel 1 to the back panel 1 are the same. However, since the material of the color filter 9 is generally different from those of the fingerprint identification electrode layer 21, the touch electrode layer 41 and the specular reflection film layer 3, patterns of the color filter 9, the fingerprint identification electrode layer 21, the touch electrode layer 41 of the touch unit and the specular reflection film layer 3 may not be formed by one patterning process, but the pattern of the color filter 9 may be formed after the patterns of the fingerprint identification electrode layer 21, the touch electrode layer 41 of the touch unit and the specular reflection film layer 3 are formed.

In an exemplary embodiment, the color filters are disposed in a one-to-one correspondence with the emitting layers 10.

As shown in FIG. 3, the touch electrode layer 41 includes multiple mesh metal wires and spacer regions between the mesh metal wires, and the fingerprint identification electrode layer 21 includes multiple fingerprint identification sub-electrodes; and the color filter 9, the fingerprint identification sub-electrode, and the specular reflection film layer 3 are disposed in the spacer region.

In an exemplary embodiment, the color filters 9 are disposed between the mesh metal wires and the fingerprint identification sub-electrodes, and the color filters 9 and the fingerprint identification sub-electrodes are respectively distributed in an array in the spacer regions.

As shown in FIG. 3, the color filters 9 include red filters 901, blue filters 902 and green filters 903 which are disposed in an array, and each of the red filter 901, the blue filter 902 and the green filter 903 is disposed in correspondence to the mesh metal wires of the touch electrode layer 41. As shown in FIG. 3, each of the red filter 901, blue filter 902 and green filter 903 is respectively disposed with a fingerprint identification sub-electrode. In some exemplary embodiments, one fingerprint identification sub-electrode may also be disposed in correspondence to multiple color filters 9, for example, a red filter 901, a blue filter 902 and a green filter 903 which correspond to a pixel unit are disposed in correspondence to a fingerprint identification sub-electrode.

In an exemplary embodiment, a red filter 901, a blue filter 902, and a green filter 903 which correspond to a pixel unit are disposed in correspondence to a fingerprint identification sub-electrode, which means that the positions are disposed in a one-to-one correspondence and adjacent to each other. In an exemplary embodiment, a red filter 901, a blue filter 902, and a green filter 903 which correspond to a pixel unit are disposed in correspondence to a fingerprint identification sub-electrode, which means that the areas, sizes or dimensions are disposed in a one-to-one correspondence.

As shown in FIG. 3, a maximum span (i.e., a maximum size) of the red filter 901 along an up-down direction in the Figure is smaller than that of the blue filter 902, so a maximum span (i.e., a maximum distance) of the fingerprint identification sub-electrode disposed in correspondence to the red filter 901 along the up-down direction in the Figure is smaller than that of the fingerprint identification sub-electrode disposed in correspondence to the blue filter 902. Two green filters 903 are defined as a green filter group, and a maximum span (i.e., a maximum size) of the blue filter 902 along an up-down direction in the Figure is larger than that of the green filter group, so a maximum span (i.e., a maximum distance) of the fingerprint identification sub-electrode disposed in correspondence to the blue filter 902 along an up-down direction in the Figure is larger than that of the fingerprint identification sub-electrode disposed in correspondence to the green filter group. A maximum span (i.e., a maximum size) of the red filter 901 along the up-down direction in the Figure may be larger than, equal to or smaller than that of the green filter group, and a maximum span (i.e., a maximum distance) of the fingerprint identification sub-electrode disposed in correspondence to the red filter 901 along the up-down direction in the Figure may also be larger than, equal to or smaller than that of the fingerprint identification sub-electrode disposed in correspondence to the green filter group.

In an exemplary embodiment, the fingerprint identification electrode layer 21, the specular reflection film layer 3 and the touch electrode layer 41 are made of a same metal material which is a highly reflective metal material, so that the fingerprint identification electrode layer 21, the specular reflection film layer 3 and the touch electrode layer 41 may all realize specular reflection, and the fingerprint identification electrode layer 21 and the touch electrode layer 41 may also realize a conductive function. In an exemplary embodiment, the highly reflective metal material may be a metal such as Ag, or Al. As the fingerprint identification electrode layer 21, the specular reflection film layer 3 and the touch electrode layer 41 are disposed in a same layer and made of a same metal material, they may be completed by one Mask process during manufacturing, which simplifies the process flow.

One or more embodiments of the present disclosure further provide a manufacturing method of a display panel for realizing the manufacturing of the display panel of any one of the aforementioned embodiments, including the following acts S101-S107.

In act S101, a back panel 1 is formed.

In this act, the back panel 1 includes organic light emitting diodes. A fingerprint identification control circuit 24 of a fingerprint identification unit when forming a pixel circuit of the organic light emitting diode. A second electrode layer 23 is formed when an anode layer 171 of the organic light emitting diode is formed.

In act S102, a thin-film encapsulation layer 6 is formed on the back panel 1, and a first via hole is opened at a position of the thin-film encapsulation layer 6 corresponding to the second electrode layer 23.

In act S103, a first electrode layer 22 and a bridge electrode 42 are formed.

In this act, a metal layer on is deposed on the thin-film encapsulation layer 6, and patterns of the first electrode layer 22 and the bridge electrode 42 are formed after exposure and etching, wherein, the first electrode layer 22 is connected with the second electrode layer 23 through the first via hole; a bridge connection between two adjacent first touch electrodes 411 is realized through the bridge electrode 42.

In act S104, a first over coat layer 7 is formed, and a second via hole is opened at a position of the first over coat layer 7 corresponding to the first electrode layer 22.

In act S105, a fingerprint identification electrode layer 21, a specular reflection film layer 3 and a touch electrode layer 41 are formed.

In this act, a metal thin film is formed on the first over coat layer 7, and patterns of the fingerprint identification electrode layer 21, the specular reflection film layer 3 and the touch electrode layer 41 are formed by one patterning process, which simplifies the process. The fingerprint identification electrode layer 21 is connected with the first electrode layer 22 through the second via hole, thereby realizing a fingerprint identification function. The specular reflection film layer 3 is grounded and serves as a shielding layer to space a first region from a third region. The touch electrode layer 41 includes first touch electrodes 411 and second touch electrodes 412 which are staggered. The first touch electrode 411 is connected with a bridge electrode 42 on a lower layer, and a bridge connection between two adjacent first touch electrodes 411 is realized through the bridge electrode 42. A connection electrode 43 is also disposed in a same layer as the touch electrode layer 41, and two adjacent second touch electrodes 412 are connected through the connection electrode 43. The touch function is realized through the first touch electrodes 411, the second touch electrodes 412, the bridge electrodes 42, the connection electrodes 43 and other structures. In an exemplary embodiment, deposition, coating, sputtering, etc. may generally be used to form thin films.

The above-mentioned operations of forming layers include but are not limited to (chemical phase, physical phase) deposition and (magnetron) sputtering, and those skilled in the art can understand that after each layer is formed, corresponding patterns may be further formed on it as required, which is not described in detail in the present disclosure.

In act S106, color filters 9 are manufactured to form a color film layer, and the color filter 9, the fingerprint identification electrode layer 21, the specular reflection film layer 3 and the touch electrode layer 41 are disposed in a same layer.

In act S107, a second over coat layer 8 is formed to protect the display panel.

One or more embodiments of the present disclosure further provide a display apparatus, which includes the display panel of any one of the aforementioned embodiments.

Those of ordinary skill in the art should understand that the discussion of any of the above embodiments is only exemplary, and is not intended to imply that the scope of the disclosure (including the claims) is limited to these embodiments. Under the idea of the present disclosure, the technical features in the above embodiments or different embodiments may also be combined, the acts may be realized in any order, and there are many other changes in different aspects of one or more embodiments of the present disclosure as mentioned above, which are not provided in details for brevity.

In addition, in order to simplify the description and discussion, commonly-known power/ground connections with integrated circuit (IC) chips and other components may or may not be shown in the provided drawings for easily understanding one or more embodiments of the present disclosure. In addition, an apparatus may be shown in a form of block diagrams in order to avoid making one or more embodiments of the present disclosure difficult to understand. Moreover a fact below is also taken into account that details of implementations of these apparatus shown in block diagrams are highly dependent on a platform on which one or more embodiments of the present disclosure will be implemented (i.e., these details should be completely within an understanding range of those skilled in the art). In a case where specific details (e.g., circuits) have been set forth to describe exemplary embodiments of the present disclosure, it is apparent to those skilled in the art that one or more embodiments of the present disclosure may be implemented without these specific details or with variations in these specific details. Therefore, these descriptions should be regarded as illustrative rather than restrictive.

Although the present disclosure has been described in conjunction with specific embodiments thereof, many substitutions, amendments and variations of these embodiments will be apparent to those of ordinary skill in the art according to the foregoing description. For example, other memory architectures, such as a dynamic RAM (DRAM) may be used in the discussed embodiments.

One or more embodiments of the present disclosure are intended to cover all such substitutions, amendments and variations that fall within a broad scope of the appended claims. Therefore, any omission, amendment, equivalent substitutions, improvement, etc. made within the spirit and principle of one or more embodiments of the present disclosure shall be included in a protection scope of the present disclosure.

What we claim is:

1. A display panel, comprising a back panel, and a fingerprint identification unit, a specular reflection film layer and a touch unit, wherein the fingerprint identification unit, the specular reflection film layer and the touch unit are disposed on the back panel, the fingerprint identification unit comprises a fingerprint identification electrode layer, the touch unit comprises a touch electrode layer; and the fingerprint identification electrode layer, the specular reflection film layer and the touch electrode layer are disposed in a same layer;
    wherein the display panel is an organic light emitting diode display panel, and an organic light emitting diode is disposed in the back panel;
    the organic light emitting diode comprises an emitting layer, and an orthographic projection of the emitting layer on the back panel does not overlap with orthographic projections of the fingerprint identification electrode layer, the specular reflection film layer and the touch electrode layer respectively on the back panel.

2. The display panel of claim 1, wherein the fingerprint identification electrode layer and the touch electrode layer are spaced by the specular reflection film layer, and the specular reflection film layer is grounded.

3. The display panel of claim 2, wherein a first spacing is disposed between the fingerprint identification electrode layer and the specular reflection film layer, and a second spacing is disposed between the specular reflection film layer and the touch electrode layer.

4. The display panel of claim 1, wherein the fingerprint identification unit further comprises a fingerprint identification control circuit disposed in the back panel, and the fingerprint identification control circuit is connected with the fingerprint identification electrode layer.

5. The display panel of claim 4, wherein the fingerprint identification unit further comprises a first electrode layer and a second electrode layer, and the fingerprint identification electrode layer is connected with the fingerprint identification control circuit through the first electrode layer and the second electrode layer;
    the second electrode layer and an anode layer of the organic light emitting diode are disposed in a same layer.

6. The display panel of claim 5, wherein a thin-film encapsulation layer is disposed between the back panel and the first electrode layer, and the first electrode layer is connected with the second electrode layer through a first via hole disposed on the thin-film encapsulation layer; and
    a first over coat layer is disposed between the thin-film encapsulation layer and the fingerprint identification electrode layer, and the fingerprint identification electrode layer is connected with the first electrode layer through a second via hole disposed on the first over coat layer.

7. The display panel of claim 5, wherein the touch electrode layer comprises a plurality of first touch electrodes disposed in sequence and a plurality of second touch electrodes disposed in sequence;
    the first touch electrodes and the second touch electrodes are staggered, and the first touch electrodes and the second touch electrodes are configured to form a mutual capacitance structure.

8. The display panel of claim 7, wherein the touch unit comprises a bridge electrode and a connection electrode; wherein the bridge electrode is configured to connect two adjacent first touch electrodes, the connection electrode is configured to connect two adjacent second touch electrodes; the bridge electrode and the first electrode layer are disposed in a same layer, and the connection electrode and the touch electrode layer are disposed in a same layer.

9. The display panel of claim 6, further comprising a color filter disposed in correspondence to the emitting layer, wherein the color filter, the fingerprint identification electrode layer, the specular reflection film layer and the touch electrode layer are disposed in a same layer.

10. The display panel of claim 9, wherein the touch electrode layer comprises a plurality of mesh metal wires and spacer regions between the mesh metal wires, and the fingerprint identification electrode layer comprises a plurality of fingerprint identification sub-electrodes;
    the color filter, the fingerprint identification sub-electrode and the specular reflection film layer are disposed in a spacer region.

11. The display panel of claim 10, wherein color filters are disposed between the mesh metal wires and the fingerprint identification sub-electrodes, and the color filters and the fingerprint identification sub-electrodes are respectively distributed in an array in the spacer regions.

12. The display panel of claim 1, wherein a second over coat layer is disposed on a side of the fingerprint identification electrode layer away from the back panel.

13. The display panel of claim 1, wherein the fingerprint identification electrode layer, the specular reflection film layer and the touch electrode layer are made of a same metal material.

14. A display apparatus, comprising a display panel, wherein the display panel comprises a back panel, and a fingerprint identification unit, a specular reflection film layer and a touch unit, wherein the fingerprint identification unit, the specular reflection film layer and the touch unit are disposed on the back panel, the fingerprint identification unit comprises a fingerprint identification electrode layer, the touch unit comprises a touch electrode layer; and the fingerprint identification electrode layer, the specular reflection film layer and the touch electrode layer are disposed in a same layer;

wherein the display panel is an organic light emitting diode display panel, and an organic light emitting diode is disposed in the back panel;

the organic light emitting diode comprises an emitting layer, and an orthographic projection of the emitting layer on the back panel does not overlap with orthographic projections of the fingerprint identification electrode layer, the specular reflection film layer and the touch electrode layer respectively on the back panel.

15. The display apparatus of claim 14, wherein the fingerprint identification electrode layer and the touch electrode layer are spaced by the specular reflection film layer, and the specular reflection film layer is grounded.

16. The display apparatus of claim 15, wherein a first spacing is disposed between the fingerprint identification electrode layer and the specular reflection film layer, and a second spacing is disposed between the specular reflection film layer and the touch electrode layer.

17. The display apparatus of claim 14, wherein the fingerprint identification unit further comprises a fingerprint identification control circuit disposed in the back panel, and the fingerprint identification control circuit is connected with the fingerprint identification electrode layer.

18. The display apparatus of claim 17, wherein the fingerprint identification unit further comprises a first electrode layer and a second electrode layer, and the fingerprint identification electrode layer is connected with the fingerprint identification control circuit through the first electrode layer and the second electrode layer;

the second electrode layer and an anode layer of the organic light emitting diode are disposed in a same layer.

19. The display apparatus of claim 18, wherein a thin-film encapsulation layer is disposed between the back panel and the first electrode layer, and the first electrode layer is connected with the second electrode layer through a first via hole disposed on the thin-film encapsulation layer; and a first over coat layer is disposed between the thin-film encapsulation layer and the fingerprint identification electrode layer, and the fingerprint identification electrode layer is connected with the first electrode layer through a second via hole disposed on the first over coat layer.

* * * * *